(12) United States Patent
Chang et al.

(10) Patent No.: US 8,159,426 B2
(45) Date of Patent: Apr. 17, 2012

(54) ORGANIC LIGHT EMITTING DISPLAY DEVICES AND METHODS OF RENDERING IMAGES THEREOF

(75) Inventors: Shih-Chang Chang, Jhudong Township, Hsinchu County (TW); Du-Zen Peng, Jhubei (TW)

(73) Assignee: Chimei Innolux Corporation, Chu-Nan (TW)

( * ) Notice: Subject to any disclaimer, the term of this patent is extended or adjusted under 35 U.S.C. 154(b) by 1759 days.

(21) Appl. No.: 11/347,694

(22) Filed: Feb. 3, 2006

(65) Prior Publication Data

US 2006/0187155 A1 Aug. 24, 2006

Related U.S. Application Data

(60) Provisional application No. 60/649,500, filed on Feb. 3, 2005.

(51) Int. Cl.
*G09G 3/32* (2006.01)

(52) U.S. Cl. ............... 345/82; 345/76; 345/83; 345/86; 313/463

(58) Field of Classification Search .......... 345/63, 345/73, 86, 104–109, 695, 30, 55, 76, 82–83; 313/463
See application file for complete search history.

(56) References Cited

U.S. PATENT DOCUMENTS

| 2003/0098825 A1* | 5/2003 | Kim et al. | 345/63 |
| 2005/0117094 A1* | 6/2005 | Kim et al. | 349/110 |
| 2006/0170712 A1* | 8/2006 | Miller et al. | 345/695 |

FOREIGN PATENT DOCUMENTS

| JP | 9115466 | 5/1997 |
| JP | 2001-290439 | 10/2001 |
| JP | 2002299055 | 10/2002 |
| JP | 2004-047194 | 2/2004 |
| TW | 588588 | 5/2004 |
| TW | 594353 | 6/2004 |
| WO | 95/00878 | 1/1995 |
| WO | 02/091299 | 11/2002 |
| WO | 03/038510 | 5/2003 |
| WO | 2005/101366 | 10/2005 |

OTHER PUBLICATIONS

Lee, Baek-woon, et al.; 40.5L: Late-News Paper: TFT-LCD with RGBW Color System; SID 2003 Digest; pp. 1212-1215.
Mameno, K., et al.; High-Performance and Low-Power AMOLED Using White Emitter with Color-Filter Array; AMD2/OLED4-1, IDW 2004, pp. 259-262.

* cited by examiner

*Primary Examiner* — Amare Mengistu
*Assistant Examiner* — Insa Sadio
(74) *Attorney, Agent, or Firm* — Liu & Liu

(57) ABSTRACT

Organic light emitting display (OLED) devices and methods of rendering image of an OLED device. A pixel of the OLED device includes a first sub-pixel corresponding to a first color, comprising a first pixel electrode and a second sub-pixel corresponding to a second color, comprising a second pixel electrode. A portion of the second pixel electrode is operatively associated with a portion of the first sub-pixel, such that activation of second pixel electrode activates both the first sub-pixel and said portion of the first sub-pixel independent of activation of the first pixel electrode.

20 Claims, 7 Drawing Sheets

ORGANIC LIGHT EMITTING DISPLAY DEVICES AND METHODS OF RENDERING IMAGES THEREOF

CROSS REFERENCE TO RELATED APPLICATIONS

This application claims the benefit of U.S. Provisional Application No. 60/649,500 filed on Feb. 3, 2005, which is fully incorporated by reference herein.

BACKGROUND OF THE INVENTION

1. Field of the Invention

The present invention relates to organic light emitting display (OLED) devices, and in particular relates to RGBW format OLED devices and methods for rendering images utilizing the same.

2. Description of the Related Art

Flat-panel displays, such as organic light emitting displays (OLED) and liquid crystal display (LCD), of various sizes are used in many computing and communication devices. In particular, OLED devices are used both indoors and outdoors under various ambient lighting conditions. Indoor applications have relatively low ambient illumination and require lower levels of display luminance. In contrast, outdoor applications can have a high ambient luminance and may require higher levels of display luminance together with low display reflectance.

FIG. 1 is a cross-section schematically illustrating a conventional white-emitting OLED structure. In FIG. 1, a substrate 10 with an indium tin oxide (ITO) anode 20 thereon is provided. A hole injection layer 22, a hole transporting layer 24, a yellow emitting layer 25, a blue emitting layer 26, and an electron transporting layer 28 are sequentially disposed on the ITO anode 20. A LiF/Al cathode 30 is disposed on the electron transporting layer 28. Emission from the blue emitting layer 26 and the yellow emitting layer 25 combine to provide a white emission that can be filtered appropriately to provide R, G, B and W emission from the display device.

While technology for OLED devices has improved dramatically, there are still some issues in its utilization in most potential applications, which are lifetime, power consumption, and others. Especially for mobile applications, low power consumption is required.

There are several methods to reduce power consumption of RGBW format OLED devices such as increasing the OLED material lighting efficiency or reducing the threshold voltage of an OLED device. Conventional OLED devices with color filter on array (COA) combined with RGBW driving function are typical methods for reducing OLED device power consumption.

FIG. 2 is a 1931 CIE x,y-chromaticity diagram showing the color gamut of a conventional RGBW format OLED device. The white point W of the unfiltered emitter (0.361, 0.380) and the desired white point D65 (0.3127, 0.3290) are provided in FIG. 2. Any color within each of the sub-triangles with the triangle RGB can be created by the appropriate combination of primary colors with white color. Since the unfiltered white point W deviates from the desired white point D65, an addition method is required to compensate for the unfiltered white pixel.

In practice, the color coordinate of a white pixel of an OLED device is not always on the desired white point D65 due to the characteristics of the OLED material and manufacturing recipes. Therefore, when displaying a white sub-pixel, not only does the white sub-pixel need to be turned on but also some of the R G B sub-pixels (in the same pixel) need to be turned on to compensate the color coordinate to the desired position. Moreover, in order to compensate the white sub-pixel, an additional driving function is required to control each R, G and B sub-pixel separately depending on the deviation of the white sub-pixel from the desired white point D65.

FIG. 3 is a block diagram illustrating a method of decoding an RGB format signal to an RGBW format signal for rendering images. Signals Ri, Gi and Bi 310 are input to a signal converter 320 converting the signals Ri, Gi and Bi 310 to output signals Ro, Go, Bo, Wo to RGBW format OLED device 350. Since the unfiltered white sub-pixel deviates from the desired white point, an additional driving function is required to compensate the white sub-pixel of the RGBW format OLED devices, thereby resulting in a more intricate image rendering method.

In an article entitled "High-Performance and Low-Power AMOLED Using White Emitter with Color-Filter Array" by K. Mameno et al., published by IDW in 2004, the authors disclose methods of decreasing the power consumption and reducing a color shift with a wide viewing angle.

U.S. Publication No. 2005/0040756, the entirety of which is hereby incorporated by reference, discloses an RGBW four color AMOLED including gamut sub-pixels that can substantially improve the efficiency and lifetime of the gamut sub-pixels.

For rendering images of an RGBW format OLED device, the algorithm of decoding an RGB signal to an RGBW signal is expressed in the following equations, $$(R_i, G_j, B_k) \rightarrow (R'_l, G'_m, B'_n, W'_p)$$

where, i, j, k, l, m, n, and p are the gray scales $$p = \min(i,j,k) \times \alpha$$

$$l = i - p$$

$$m = j - p$$

$$n = k - p$$

For power consumption reduction consideration the $\alpha$ is usually set as 1. And the luminance will be converted to for portion, i.e., $$L(R'_l) = L(R_i) - L(R_p),$$

$$L(G'_m) = L(G_j) - L(G_p),$$

$$L(B'_n) = L(B_k) - L(B_p), \text{ and}$$

$$L(W'_p)$$

As mentioned above, the color coordinate of the white OLED must have some R, G, or B luminance added to compensate the white color coordinate to the desired position, therefore, it can be written as following equation, $$L(W'_p) = L(w_p) + L(r_p) + L(g_p) + L(b_p)$$

where, $L(w_p)$ is the white OLED luminance, and $L(r_p)$, $L(g_p)$, $L(b_p)$ are the compensation luminance for red, green and blue sub-pixels, respectively.

In the actual pixel driving for the RGBW sub-pixels, the actual luminance for each sub-pixel to achieve the desired overall luminance will be, $$L(R'_l) = L(R_i) - L(R_p) + L(r_p),$$

$$L(G'_m) = L(G_j) - L(G_p) + L(g_p),$$

$$L(B'_n) = L(B_k) - L(B_p) + L(b_p), \text{ and}$$

$$L(W'_p) + L(w_p)$$

The actual data signal will be very complicated and when the color coordinate of the white OLED changes or improves, the $L(r_p)$, $L(g_p)$, and $L(b_p)$ compensation luminance will also change. To solve this issue, it may take more resources to modify the additional driving function, and also increase fabrication costs.

SUMMARY OF THE INVENTION

The invention is directed to a novel pixel structure for a color display device, which provides for color compensation in the sub-pixels to achieve a desired color rendering of the pixel.

In one aspect of the present invention, a portion of the pixel electrode of a color sub-pixel is operatively associated with a portion of another color sub-pixel, such that activation of the pixel electrode activates both the color sub-pixel and the portion of the other color sub-pixel independent of activation of a pixel electrode for the other color sub-pixel. In one embodiment, each color sub-pixel comprises a color filter of a different color, and a light emitting element is positioned with respect to the respective color filter, wherein a portion of at least one light emitting element associated with one color filter is positioned with respect to at least another color filter, such that activation of said at least one light emitting element renders colored lights corresponding to at least two color filters. In one embodiment, the light emitting element is positioned with respect to two color filters.

In another aspect of the present invention, the novel pixel structure is deployed in an OLED display device.

In a further aspect of the present invention, a method of rendering color of a pixel in a display device comprises the steps of providing a first signal to activate a first sub-pixel to render a first color, and providing a second signal to activate the second sub-pixel to render a second color and a portion of the first sub-pixel to render the first color independent of the first signal. Further, the first signal and second signal may be controlled to selectively activate the first sub-pixel and second sub-pixel to render a desired color.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

According to the invention, red $L(r_p)$, green $L(g_p)$ blue $(b_p)$ represent separate compensation luminance of the white sub-pixel. Two of the three compensation luminance are typically required to compensate the white OLED color coordinate. Therefore, by appropriately redistributing the area ratio of each red R, green G, blue B, and white W sub-pixels, luminance of white emitting sub-pixel can be compensated by adding the compensation luminance of $L(r_p)$, $L(g_p)$ and $L(b_p)$. And at least one of the compensation luminance $L(r_p)$, $L(g_p)$, and $L(b_p)$ are controlled by the white sub-pixel using the same pixel electrode without employing an additional intricate driving function.

In one aspect of the invention, the pixel electrode of white sub-pixel is extended to R and G sub-pixel, and partially overlaps the CF region in R and G sub-pixels. In this case, the compensation luminance $L(r_p)$ and $L(g_p)$ is controlled by the white pixel spontaneously. The compensation ratio can be easily changed by adjusting the overlapping region, to get the desired white coordinate.

Figure 1:
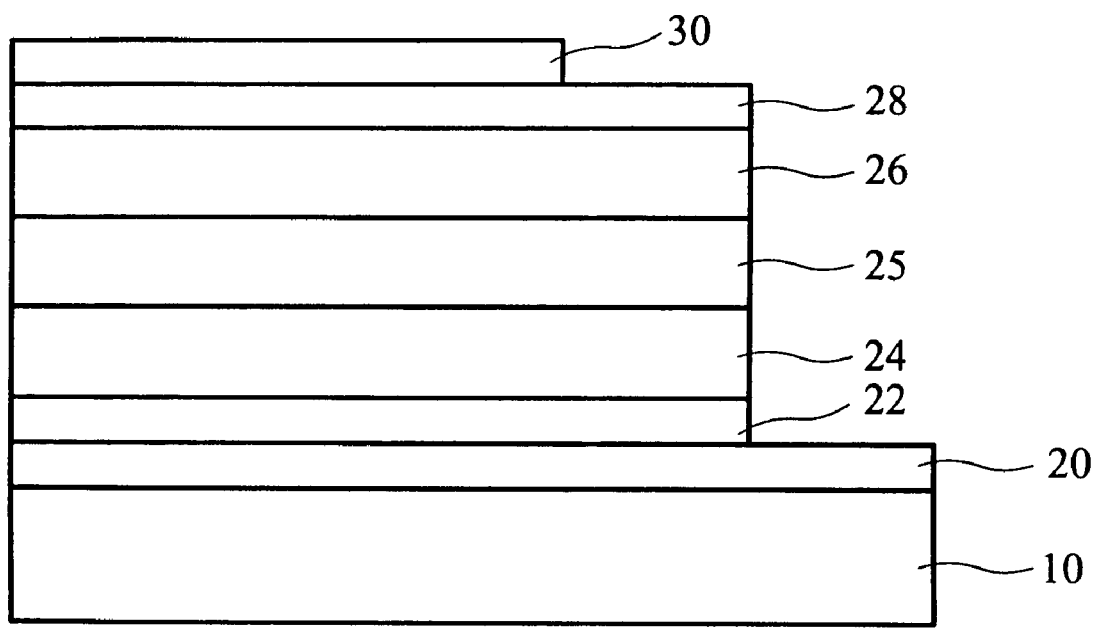
FIG. 1 is a cross-section schematically illustrating a conventional white-emitting OLED structure.
Figure 2:
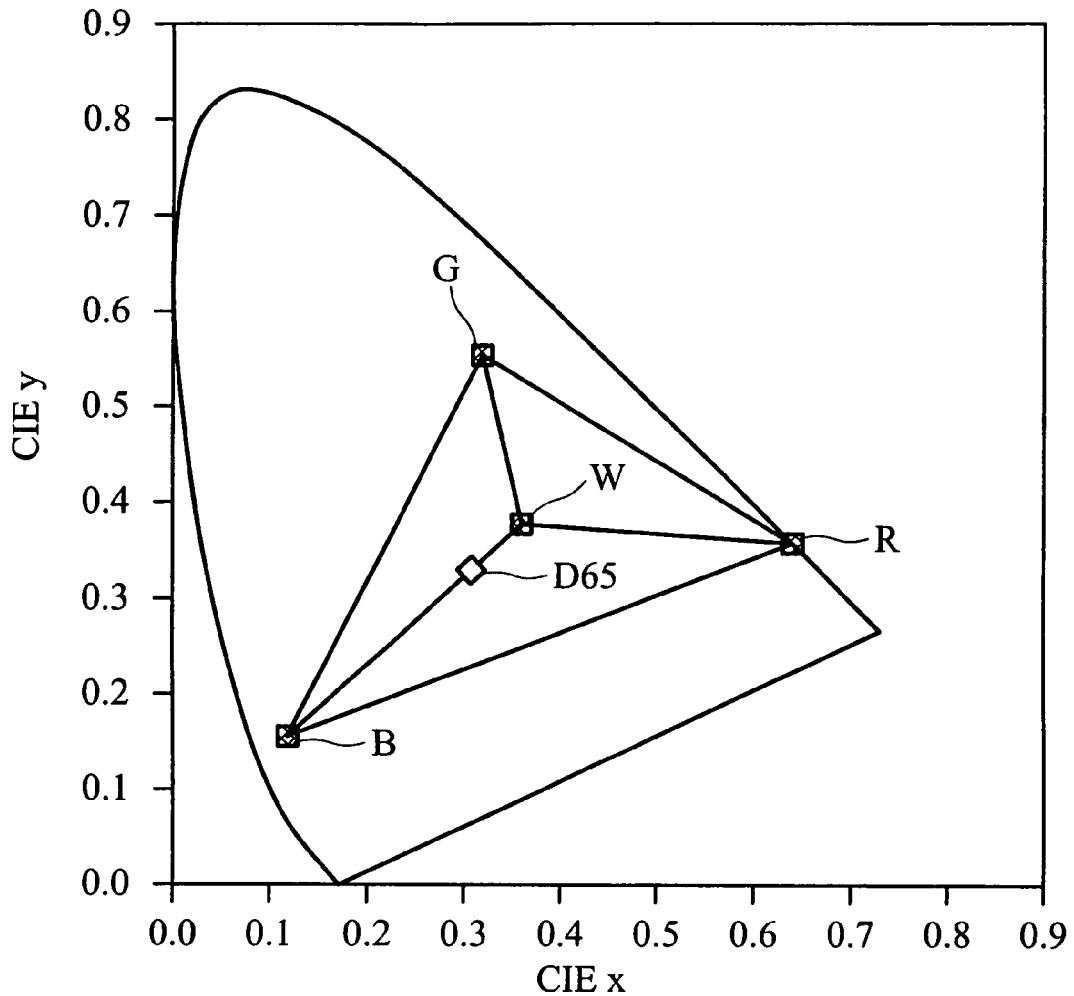
FIG. 2 is a 1931 CIE x,y-chromaticity diagram showing the color gamut of a conventional RGBW format OLED device.
Figure 3:
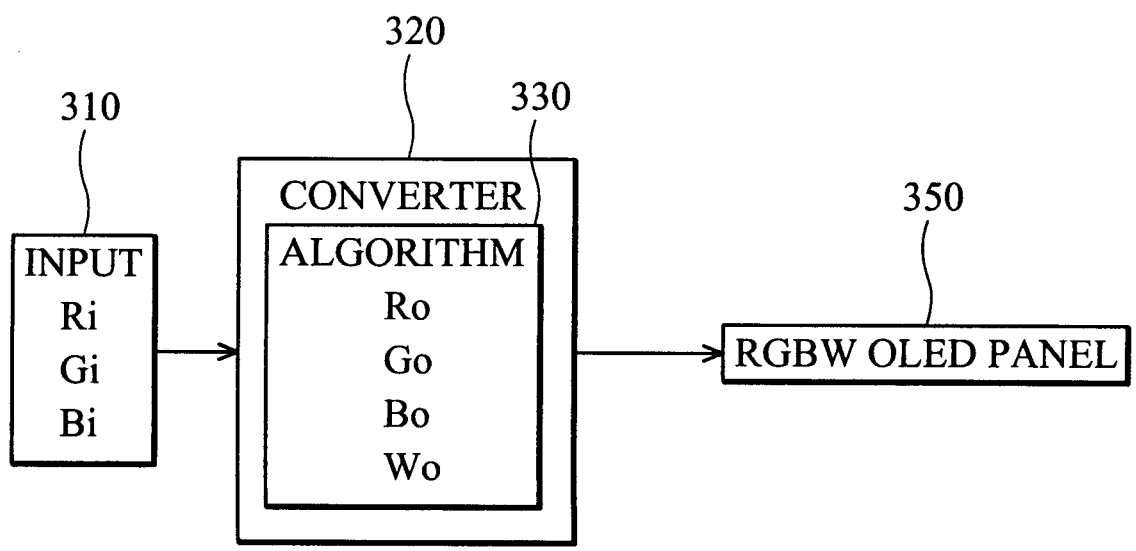
FIG. 3 is a block diagram illustrating a method of decoding RGB signals to RGBW signals for rendering images.
Figure 4:
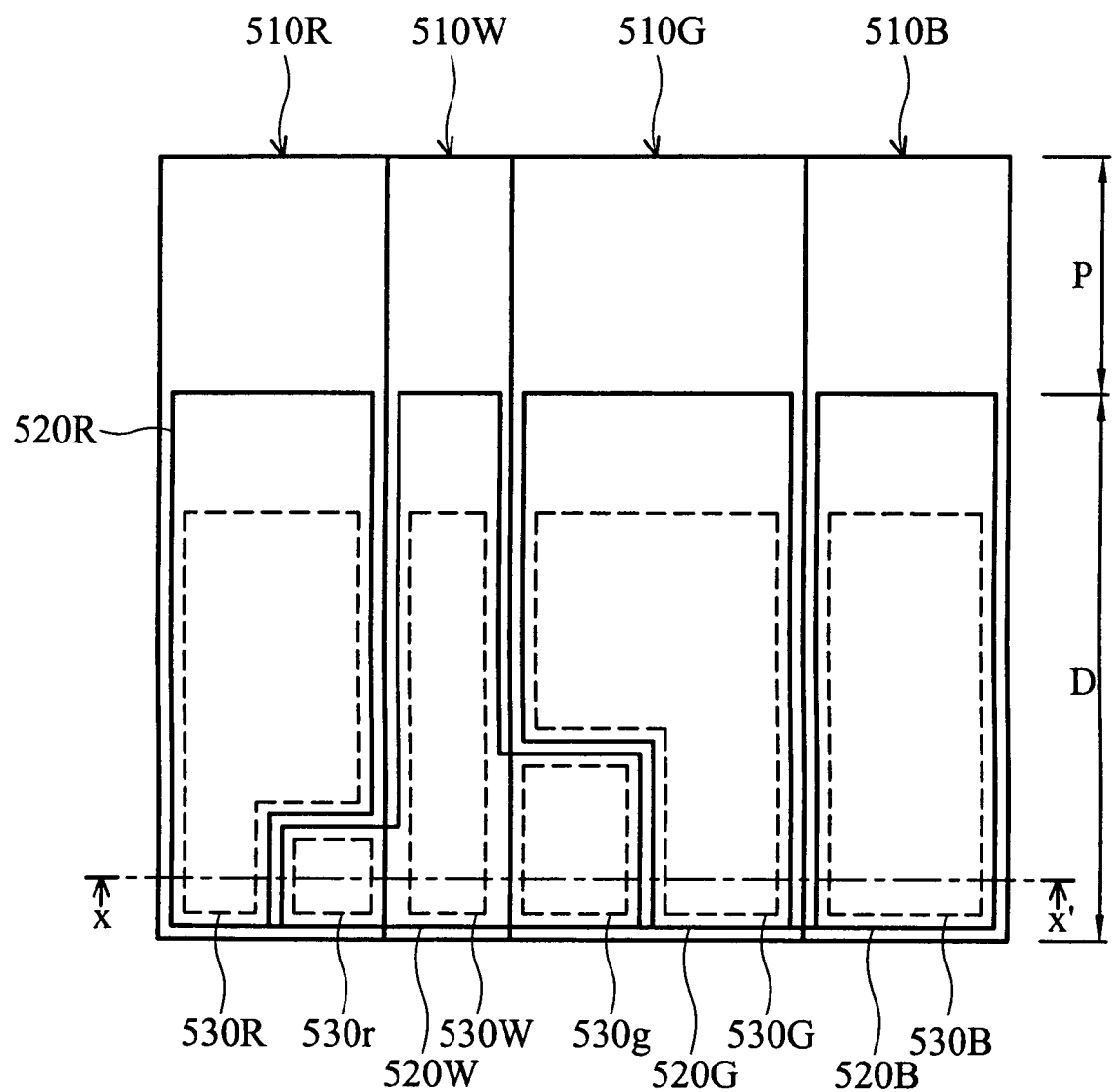
FIG. 4 is a plan view of a layout of sub-pixels according an embodiment of the invention.

FIG. 4 is a plan view of a layout of sub-pixels according to an embodiment of the invention. 510R, 510W, 510G and 510B are the respective red, white, green and blue sub-pixels as represented by respective color filters. 520R, 520W, 520G and 520B are the electrodes for the respective red, white, green and blue sub-pixels. 530R, 530W, 530G and 530B are the pixel definition areas for the respective red, white, green and blue sub-pixels. 530r and 530g are the extension areas for the red and green sub-pixels. The white sub-pixel 510W is compensated by additional extension areas of 530r and 530g. The area ratio of the white sub-pixel 530W:530r:530g is preferably equal to the ratio 77.7:7.7:17.6. More specifically, a portion of the pixel electrode of the white sub-pixel is operatively associated with a portion of adjacent red and green sub-pixels, such that activation of the pixel electrode activates both the white sub-pixel and the portion of adjacent red 530r and green 530g sub-pixels. In this embodiment, the blue sub-pixel 510B is independent from activation of the pixel electrode for the white sub-pixel 510W.

Figure 5A:
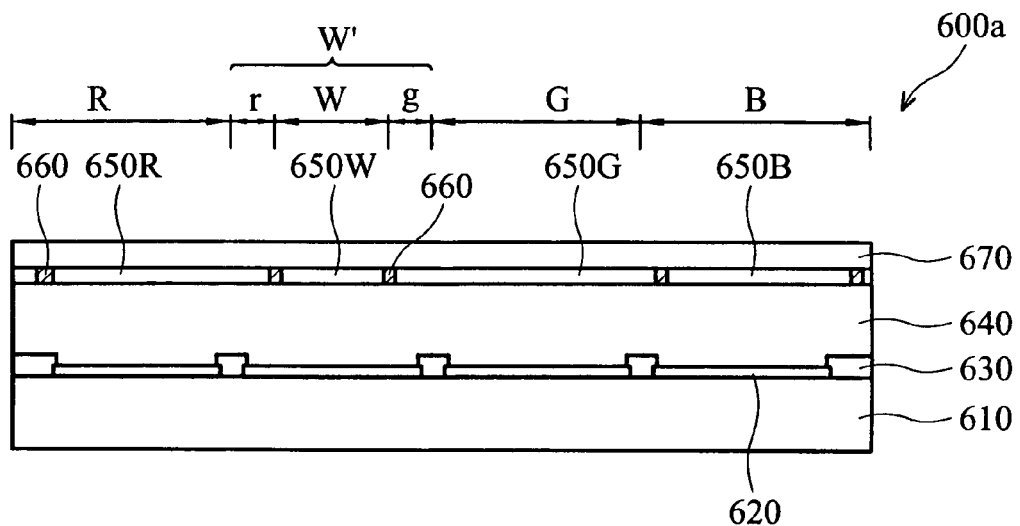
FIG. 5A is a sectional view illustrating distribution of RGBW sub-pixels in a top emission OLED device according to an embodiment of the invention.

FIG. 5A is a sectional view (e.g., generally taken along line x-x' in FIG. 4) illustrating distribution of RGBW sub-pixels in a top emission OLED device according to an embodiment of the invention. In FIG. 5A, each light emitting element is disposed between each sub-pixel electrode and the corresponding color filter, wherein a sub-pixel electrode extends to a neighboring color filter. A top emission OLED device 600a includes a substrate 610 with a plurality of pixel electrodes 620 thereon. Substrate 610 can be a transparent substrate such as glass or a thin film transistor (TFT) array substrate. Each pixel electrode 620 is isolated by insulator layer 630. A stack of white OLED element 640 is disposed overlying the substrate 610. Color filters including red 650R, white 650W, green 650G and blue 650B are disposed on the stack of white OLED elements 640. Each of the color filters is isolated by a network or a grid of black matrix 660. A passivation layer 670 is disposed on the color filters.

Note that the color filter 650W of the white sub-pixel can be a clear filter, a white filter, or no filter, thereby emitting unfiltered white light when the pixel electrode is activated.

The white OLED element 640, preferably a top emission OLED, emitting light toward an observer, emits the spectrum comprising red R, green G, and blue B colors. Activation of the white OLED element 640 renders light passing through corresponding color filters to generate appropriate filtered color. In one embodiment of the invention, portions of the color filter of the adjacent sub-pixels of red 650R and green 650G are extended overlying portions of the white sub-pixel electrode. Therefore, additional components of red r and green g in association with white W create a compensated white component W', when the pixel electrode of the white sub-pixel is activated.

In this embodiment, a portion of at least one light emitting element associated with one color filter is positioned with respect to at least another color filter, such that activation of said at least one light emitting element renders colored light corresponding to at least two color filters.

Figure 5B:
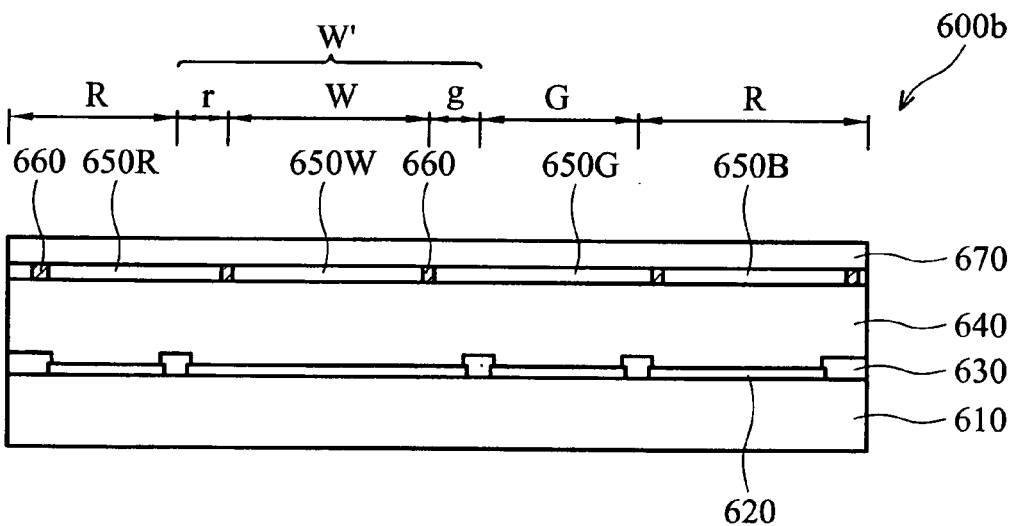
FIG. 5B is a sectional view illustrating distribution of RGBW sub-pixels in a top emission OLED device according to an alternative embodiment of the invention.

FIG. 5B is a sectional view illustrating distribution of RGBW sub-pixels in a top emission OLED device according to an alternative embodiment of the invention. In this embodiment, the width of the white sub-pixel electrode is wide enough to extend to a portion of adjacent red and green color sub-pixels. In FIG. 5B, each light emitting element is disposed between each sub-pixel electrode and the corresponding color filter, wherein a color filter extends to a sub-pixel electrode. Each color filter can be provided in consistent with each corresponding sub-pixel area. The pixel electrode of the white sub-pixel is extended to portions of the adjacent sub-pixels of red and green. Therefore, addition components of red r and green g in association with white W create a compensated white component W', when the pixel electrode of the white sub-pixel is activated.

Figure 6A:
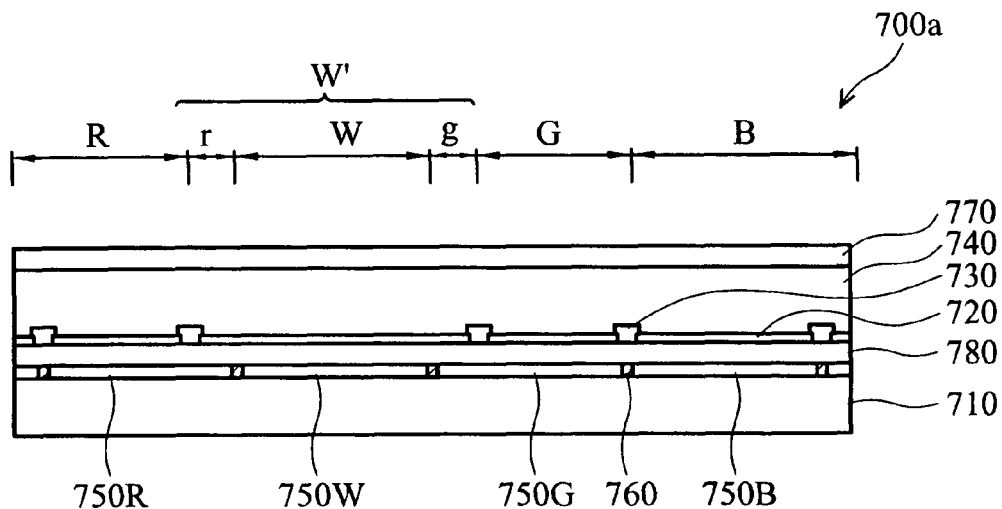
FIG. 6A is a sectional view illustrating distribution of RGBW sub-pixels in a bottom emission OLED device according to an embodiment of the invention.

FIG. 6A is a sectional view (e.g., generally taken along line x-x' in FIG. 4) illustrating distribution of RGBW sub-pixels in a bottom emission OLED device according to an embodiment of the invention. In FIG. 6A, each sub-pixel electrode is disposed between each light emitting element and the corresponding color filter, wherein a sub-pixel electrode extends to a neighboring color filter. A bottom emission OLED device 700a includes a substrate 710 with color filters including red 750R, white 750W, green 750G and blue 750B disposed thereon. Each of the color filters is isolated by a network or a grid of black matrix 760. A planarization layer 780 is disposed on the color filters. A plurality of pixel electrodes 720 are disposed on the planarization layer 780. Each pixel electrode 720 is isolated by insulator layer 730. A stack of white OLED elements 740 is disposed overlying the pixel electrodes 720. The stack of white OLED elements 740 emits light passing through each color filter. A passivation layer 770 is disposed on the stack of white OLED elements 740. Each color filter can be provided consistent with each corresponding sub-pixel area. The pixel electrode of the white sub-pixel is extended to portions of the adjacent sub-pixels of red and green. Therefore, addition components of red r and green g in association with white W create a compensated white component W', when the pixel electrode of the white sub-pixel is activated.

Note that the color filter 750W of the white sub-pixel can be a clear filter, a white filter, or no filter, thereby emitting unfiltered white light when the pixel electrode is activated.

In this embodiment, a portion of at least one light emitting element associated with one color filter is positioned with respect to at least another color filter, such that activation of said at least one light emitting element renders colored light corresponding to at least two color filters. More specifically, a portion of at least one light emitting element is positioned with respect to at least another color filter, such that activation of said at least one light emitting element renders colored light corresponding to at least two color filters.

Figure 6B:
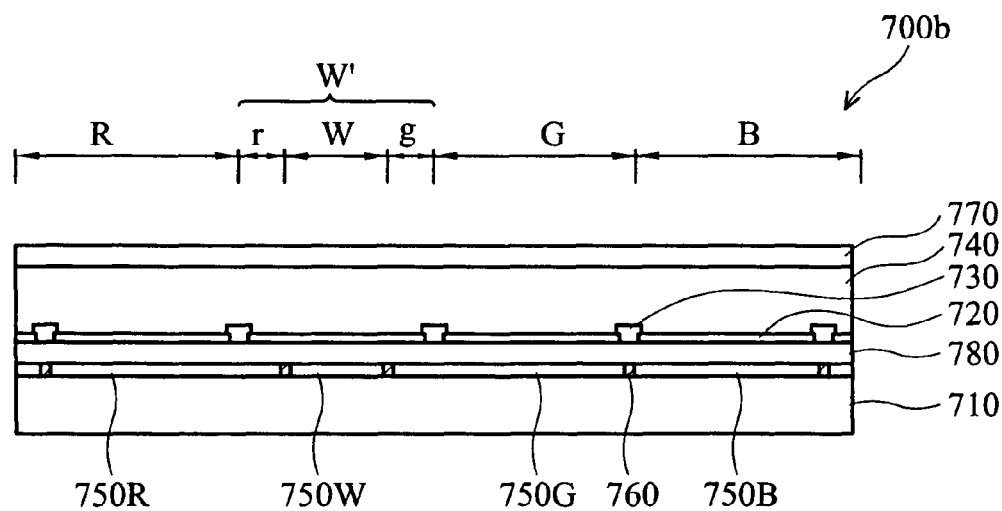
FIG. 6B is a sectional view illustrating distribution of RGBW sub-pixels in a bottom emission OLED device according to an alternative embodiment of the invention.

FIG. 6B is a cross section of the distribution of RGBW sub-pixels in a bottom emission OLED device according to an alternative embodiment of the invention. In FIG. 6B, each sub-pixel electrode is disposed between each light emitting element and the corresponding color filter, wherein a color filter extends to a sub-pixel electrode. Each pixel electrode 720 can be provided consistent with each corresponding sub-pixel area. The color filter 750R and 750B of the adjacent sub-pixels of red and green may extend to a portion of the white sub-pixel. Therefore, addition components of red r and green g in association with white W create a compensated white component W', when the pixel electrode of the white sub-pixel is activated.

Accordingly, some of the color filter region can be extended to the white sub-pixel, which will achieve color compensation. The ratio of the compensation luminance $L(r_p)$, $L(g_p)$ and $L(b_p)$ can be adjusted by the overlapping of the white sub-pixel electrode and color filter pattern of RGB sub-pixels to get the desired white coordinate.

The invention offers an advantage in that the luminance of the compensated white sub-pixel is controlled by activating the pixel electrode of the white sub-pixel spontaneously without an additional intricate driving function. Furthermore, the white color coordinate is relatively easily predefined by adjusting the overlapping area of white sub-pixel electrode and RGB sub-pixel color filter patterns. Moreover, images with a large amount of white content displayed using an RGBW format will require less than ½ the power consumption of an RGB format, as a consequence of the highly efficient of white luminance. The red, white, green and blue sub-pixels may be selectively activated to render a desired overall color for the pixel.

Figure 7:
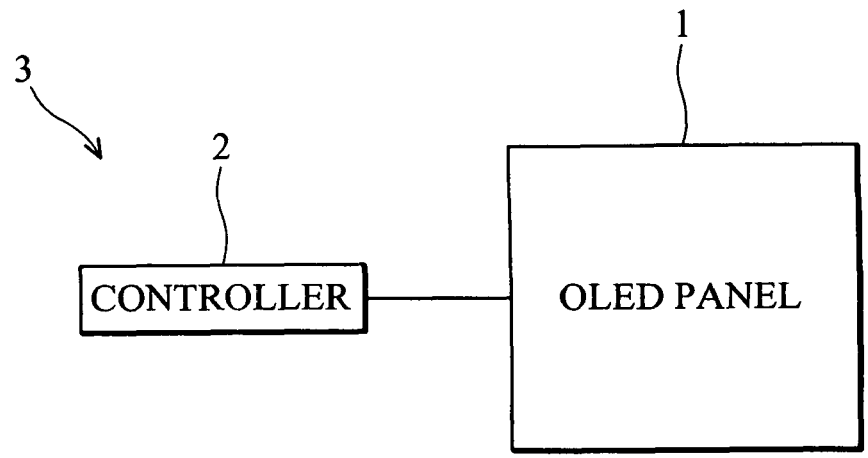
FIG. 7 is a schematic diagram of an OLED module in accordance with an embodiment of the present invention.

FIG. 7 is a schematic diagram of an OLED module 3 (e.g., a video display module) comprising an embodiment of an OLED device 1. The OLED device 1 is coupled to a controller 2, forming an OLED module 3 as shown in FIG. 7. The controller 3 comprises, e.g., source and a gate driving circuits (not shown) to control activation of the sub-pixels in the OLED device 1 to render images in accordance with an input. The controller 3 may comprise a converter converting input signals Ri, Gi and Bi to output signals Ro, Go, Bo, and Wo to the OLED device 1.

Figure 8:
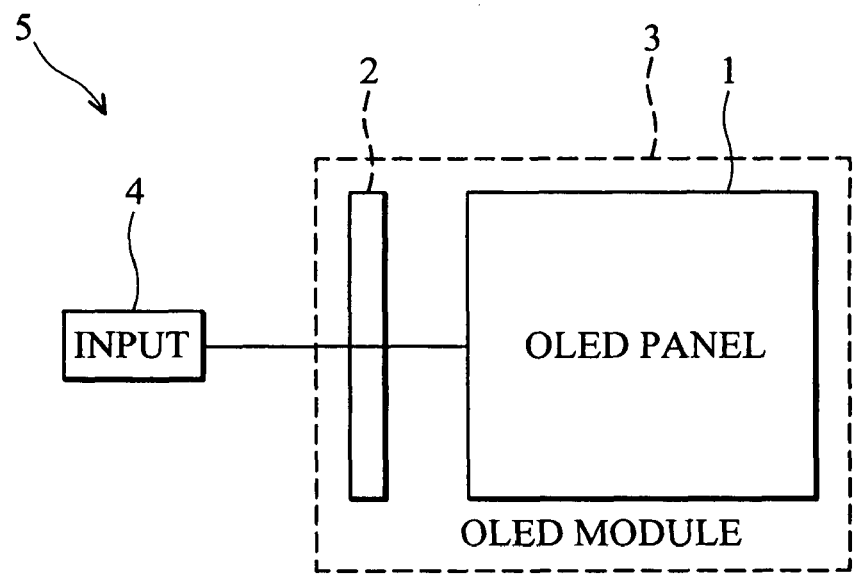
FIG. 8 is a schematic diagram of an electronic device, incorporating an OLED module in accordance with an embodiment of the present invention.

FIG. 8 is a schematic diagram of an electronic device 5, incorporating an OLED module 3 comprising the OLED device 1. An input device 4 is coupled to the controller 2 of the OLED module 3. Input device 4 includes a graphics or video controller, such as a processor or the like to input data to the controller 2 to render an image. The electronic device 5 may be a portable device such as a PDA, notebook computer, tablet computer, cellular phone, or a desktop computer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pixel structure for a color display device, comprising:
   a first sub-pixel corresponding to a first color, comprising a first pixel electrode; and
   a second sub-pixel corresponding to a second color, comprising a second pixel electrode, wherein a portion of the second pixel electrode is operatively associated with a portion of the first sub-pixel, such that activation of second pixel electrode activates both the second sub-pixel and said portion of the first sub-pixel independent of separate activation of the first pixel electrode,
   wherein the first sub-pixel further comprises a first color filter of the first color, and the second sub-pixel further comprises a second color filter of the second color, and wherein said portion of the second pixel electrode extends to overlap a portion of the first color filter associated with said portion of the first sub-pixel.

2. The pixel structure as in claim 1, wherein the first sub-pixel further comprises a first light emitting element positioned with respect to the first color filter to render a first colored light corresponding to the first color when the first light emitting element is activated, wherein the second sub-pixel further comprises a second light emitting element positioned with respect to the second color filter to render a second colored light corresponding to the second color, and wherein a portion of the second light emitting element is positioned with respect to the first color filter, such that activation of the second light emitting element renders colored lights corresponding to the first color and the second color independent of activation of the first light emitting element.

3. A display device comprising the pixel structure of claim 2.

4. A display device as in claim 3, wherein the first and second light emitting elements comprise OLEDs.

5. An OLED module, comprising:
   a display device as in claim 4; and
   a controller coupled to the OLED device to control the panel to render an image in accordance with an input.

6. An electronic device, comprising:
   the OLED module as claimed in claim 5; and
   an input device coupled to the controller of the liquid crystal display device to control the display device to render an image.

7. The pixel structure as in claim 1, wherein the second color is white, the second color filter is one of a clear filter, a white filter, or no filter, and the second light emitting element emits white light.

8. A method of rendering color of a pixel in a display device, comprising:
   providing a pixel structure as in claim 1;
   activating the first sub-pixel to render a first color; and
   activating the second sub-pixel to render a second color and a portion of the first sub-pixel to render the first color independent of separate activation of the first sub-pixel.

9. The pixel structure as in claim 1, wherein the first pixel electrode and the second pixel electrode overlap with the first color filter of the first sub-pixel of the first color.

10. A pixel structure for a color display device, comprising:
    a plurality of color filters, comprising a first color filter of a first color corresponding to a first sub-pixel and a second color filter of a second color corresponding to a second color sub-pixel; and
    a plurality of light emitting elements comprising a first pixel electrode corresponding to the first sub-pixel and a second pixel electrode corresponding to the second sub-pixel, each light emitting element associated and positioned with respect to a color filter to render a colored light corresponding to the associated color filter when the associated light emitting element is activated, wherein a portion of at least one light emitting element is positioned with respect to at least another color filter, such that activation of said at least one light emitting element renders colored light corresponding to at least two color filters,
    wherein at least a portion of the second pixel electrode extends to overlap a portion of the first color filter associated with a portion of the first sub-pixel, such that activation of second pixel electrode activates both the second sub-pixel and said portion of the first sub-pixel independent of separate activation of the first pixel electrode.

11. The pixel structure as in claim 10, wherein the first pixel electrode and the second pixel electrode overlap with the first color filter of the first sub-pixel of the first color.

12. A pixel structure for a color display device, comprising:
    a substrate;
    a plurality of sub-pixel electrodes supported on the substrate, comprising a first pixel electrode corresponding to the first sub-pixel and a second pixel electrode corresponding to a second sub-pixel;
    a plurality of light emitting elements supported on the substrate, each associated and positioned with respect to a sub-pixel electrode to render a white light;
    a plurality of color filters supported on the substrate, comprising a first color filter of a first color corresponding to the first sub-pixel and a second color filter of a second color corresponding to the second color sub-pixel, each associated with a light emitting element, wherein a portion of at least one light emitting element is positioned operatively with respect to at least another color filter, such that activation of said at least one light emitting element renders colored light corresponding to at least two color filters,
    wherein at least a portion of the second pixel electrode extends to overlap a portion of the first color filter associated with a portion of the first sub-pixel, such that activation of second pixel electrode activates both the second sub-pixel and said portion of the first sub-pixel independent of separate activation of the first pixel electrode.

13. The pixel structure as in claim 12, wherein each light emitting element is disposed between each sub-pixel electrode and the corresponding color filter, wherein a sub-pixel electrode extends to a neighboring color filter.

14. The pixel structure as in claim 12, wherein each light emitting element is disposed between each sub-pixel electrode and the corresponding color filter, wherein a color filter extends to a sub-pixel electrode.

15. The pixel structure as in claim 12, wherein each sub-pixel electrode is disposed between each light emitting element and the corresponding color filter, wherein a sub-pixel electrode extends to a neighboring color filter.

16. The pixel structure as in claim 12, wherein each sub-pixel electrode is disposed between each light emitting element and the corresponding color filter, wherein a color filter extends to a sub-pixel electrode.

17. The pixel structure as in claim 12, wherein the first pixel electrode and the second pixel electrode overlap with the first color filter of the first sub-pixel of the first color.

18. A method of rendering color of a pixel in a display device, comprising:
    defining a first sub-pixel corresponding to a first color, comprising a first pixel electrode;

defining a second sub-pixel corresponding to a second color, comprising a second pixel electrode, wherein a portion of the second pixel electrode is operatively associated with a portion of the first sub-pixel;

activating the first sub-pixel to render a first color; and activating the second sub-pixel to render a second color and a portion of the first sub-pixel to render the first color independent of separate activation of the first sub-pixel, wherein the first sub-pixel further comprises a first color filter of the first color, and the second sub-pixel further comprises a second color filter of the second color, and wherein said portion of the second pixel electrode extends to overlap a portion of the first color filter associated with said portion of the first sub-pixel.

19. The method as in claim 18, further comprising providing a first signal to activate the first sub-pixel, and a second signal to activate the second sub-pixel.

20. The method as in claim 18, further comprising controlling provision of the first signal and second signal to selectively activate the first sub-pixel and second sub-pixel to render a desired color for the pixel.

* * * * *